(12) United States Patent
Nomura et al.

(10) Patent No.: US 11,315,804 B2
(45) Date of Patent: Apr. 26, 2022

(54) MANUFACTURING METHOD OF MOUNTING STRUCTURE

(71) Applicant: NAGASE CHEMTEX CORPORATION, Osaka (JP)

(72) Inventors: Eiichi Nomura, Tatsuno (JP); Yutaka Miyamoto, Tatsuno (JP); Takayuki Hashimoto, Tatsuno (JP)

(73) Assignee: NAGASE CHEMTEX CORPORATION, Osaka (JP)

( * ) Notice: Subject to any disclaimer, the term of this patent is extended or adjusted under 35 U.S.C. 154(b) by 175 days.

(21) Appl. No.: 16/772,608

(22) PCT Filed: Dec. 13, 2018

(86) PCT No.: PCT/JP2018/045942
§ 371 (c)(1),
(2) Date: Jun. 12, 2020

(87) PCT Pub. No.: WO2019/117259
PCT Pub. Date: Jun. 20, 2019

(65) Prior Publication Data
US 2020/0388509 A1     Dec. 10, 2020

(30) Foreign Application Priority Data
Dec. 4, 2017    (JP) .............................. JP2017-240021

(51) Int. Cl.
*H01L 21/56*     (2006.01)
*H01L 23/12*     (2006.01)
(Continued)

(52) U.S. Cl.
CPC .............. *H01L 21/56* (2013.01); *H01L 23/12* (2013.01); *H01L 23/31* (2013.01); *H03H 3/08* (2013.01);
(Continued)

(58) Field of Classification Search
CPC ....................................................... H01L 21/56
(Continued)

(56) References Cited

U.S. PATENT DOCUMENTS

2004/0213973 A1    10/2004   Hara et al.
2006/0151203 A1     7/2006   Krueger et al.
(Continued)

FOREIGN PATENT DOCUMENTS

JP     H09-61456 A     3/1997
JP    2002-184884 A     6/2002
(Continued)

OTHER PUBLICATIONS

Extended European Search Report (EESR) dated Aug. 11, 2021 from the European Patent Office in EP Application No. 18888529.7.
(Continued)

*Primary Examiner* — Ajay Arora
(74) *Attorney, Agent, or Firm* — Sughrue Mion, PLLC

(57) ABSTRACT

A manufacturing method of a mounting structure, the method including a step of preparing a mounting member including a first circuit member and a plurality of second circuit members placed on the first circuit member; a disposing step of disposing a thermosetting sheet and a thermoplastic sheet on the mounting member, with the thermosetting sheet interposed between the thermoplastic sheet and the first circuit member; a first sealing step of pressing a stack of the thermosetting sheet and the thermoplastic sheet against the first circuit member, and heating the stack, to seal the second circuit members and to cure the thermosetting sheet into a first cured layer; a removal step of removing the thermoplastic sheet from the first cured layer; and a coating film formation step of forming a coating film on the first cured layer, after the removal step. At least one of the second circuit members is a hollow member having a space from the
(Continued)

first circuit member, and in the first sealing step, the second circuit members are sealed so as to maintain the space.

17 Claims, 5 Drawing Sheets

(51) Int. Cl.
    *H01L 23/31*     (2006.01)
    *H03H 3/08*     (2006.01)
    *H03H 9/25*     (2006.01)
    *H05K 1/14*     (2006.01)
    *H05K 3/46*     (2006.01)

(52) U.S. Cl.
    CPC ............... *H03H 9/25* (2013.01); *H05K 1/144* (2013.01); *H05K 3/4632* (2013.01); *H05K 2203/068* (2013.01); *H05K 2203/1147* (2013.01)

(58) Field of Classification Search
    USPC .......................................................... 438/127
    See application file for complete search history.

(56) References Cited

U.S. PATENT DOCUMENTS

| 2013/0082367 | A1 | 4/2013 | Yoo | |
| 2015/0235871 | A1* | 8/2015 | Akiba | H01L 24/97 |
| | | | | 438/113 |
| 2017/0012003 | A1* | 1/2017 | Yoo | H01L 23/315 |
| 2018/0327593 | A1 | 11/2018 | Kasahara et al. | |

FOREIGN PATENT DOCUMENTS

| JP | 2004-327623 A | 11/2004 |
| JP | 2005-536879 A | 12/2005 |
| JP | 2008-098419 A | 4/2008 |
| JP | 2013-118260 A | 6/2013 |
| JP | 2014-057041 A | 3/2014 |
| JP | 2015-053470 A | 3/2015 |
| JP | 2015-106573 A | 6/2015 |
| JP | 2015-179814 A | 10/2015 |
| JP | 2015-217548 A | 12/2015 |
| JP | 2015-221499 A | 12/2015 |
| JP | 2017-092103 A | 5/2017 |
| JP | 2017-108183 A | 6/2017 |
| KR | 10-1250677 B1 | 4/2013 |
| TW | 201639921 A | 11/2016 |

OTHER PUBLICATIONS

Third Party Observation issued Nov. 1, 2019 in International Application No. PCT/JP2018/045942.
Office Action dated Dec. 16, 2021 from the Taiwanese Patent Office in Taiwanese Application No. 107145316.
International Search Report for PCT/JP2018/045942 dated Feb. 19, 2019 (PCT/ISA/210) English abstract.

* cited by examiner

MANUFACTURING METHOD OF MOUNTING STRUCTURE

CROSS REFERENCE TO RELATED APPLICATIONS

This application is a National Stage of International Application No. PCT/JP2018/045942 filed Dec. 13, 2018, claiming priority based on Japanese Patent Application No. 2017-240021, filed Dec. 14, 2017.

TECHNICAL FIELD

The present invention relates to a manufacturing method of a mounting structure, specifically to a manufacturing method of a sealed mounting structure.

BACKGROUND ART

Some electronic components (circuit members) placed on a circuit board needs a space from the circuit board. One example is a SAW chip used for noise cancellation in cellular phones and other devices. The SAW chip filters a desired frequency by utilizing a surface acoustic wave that propagates on a piezoelectric substrate (piezoelectric body). Therefore, a space is necessary between the electrodes on the piezoelectric body and the circuit board on which the SAW chip is placed. For sealing such a circuit member (hollow member) with a space from the circuit board (internal space), a sheet-form sealing material is sometimes used.

Furthermore, with recent miniaturization of electronic devices, circuit boards have been required to be miniaturized, and the distance between the circuit members (including a hollow member) placed on a circuit board has been getting smaller. For sealing such circuit members with a sheet-form sealing material, the sheet-form sealing material is required to have physical properties that allow it to enter narrow gaps between the circuit members but not to enter the internal space. In this regard, Patent Literature 1 discloses a sheet configured such that the ratio of an entry speed between circuit members arranged at an interval of 100 μm to an entry speed into an internal space having a height of 20 μm from the circuit board is large.

CITATION LIST

Patent Literature

[PTL 1] Japanese Laid-Open Patent Publication No. 2015-106573

SUMMARY OF INVENTION

Technical Problem

When a sheet-form sealing material as disclosed in Patent Literature 1 is used to seal a plurality of circuit members including a hollow member, the sheet-form sealing material behaves differently when entering the gaps between the circuit members and when going to enter the internal space. Therefore, even when using the sheet disclosed in Patent Literature 1, it is difficult to collectively seal a plurality of circuit members including a hollow member, so as to maintain the internal space.

Solution to Problem

One aspect of the present invention relates to a manufacturing method of a mounting structure, the method including:

a step of preparing a mounting member including a first circuit member and a plurality of second circuit members placed on the first circuit member;

a disposing step of disposing a thermosetting sheet and a thermoplastic sheet on the mounting member, with the thermosetting sheet interposed between the thermoplastic sheet and the first circuit member;

a first sealing step of pressing a stack of the thermosetting sheet and the thermoplastic sheet against the first circuit member, and heating the stack, to seal the second circuit members and to cure the thermosetting sheet into a first cured layer;

a removal step of removing the thermoplastic sheet from the first cured layer; and a coating film formation step of forming a coating film on the first cured layer, after the removal step, wherein at least one of the plurality of second circuit members is a hollow member having a space from the first circuit member, and in the first sealing step, the plurality of second circuit members are sealed so as to maintain the space.

Advantageous Effects of Invention

According to the above aspect of the present invention, a plurality of circuit members including a hollow member can be collectively sealed so as to maintain the internal space.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Figure 1:
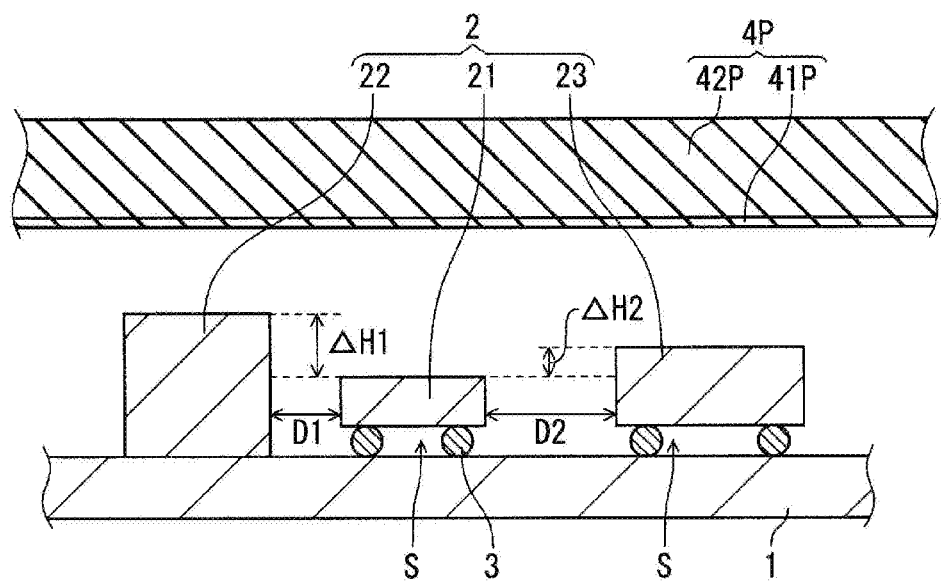
FIG. 1 A schematic diagram for explaining a first preparation step and a second preparation step in a manufacturing method according to one embodiment of the present invention by way of a cross section of a mounting member or mounting structure.

A manufacturing method of a mounting structure according to one aspect of the present invention includes: a step of preparing a mounting member including a first circuit member and a plurality of second circuit members placed on the first circuit member; a disposing step of disposing a thermosetting sheet and a thermoplastic sheet on the mounting member; a sealing step (first sealing step) of pressing a stack of the thermosetting sheet and the thermoplastic sheet against the first circuit member, and heating the stack, to seal the second circuit members; and a removal step of removing the thermoplastic sheet. Here, at least one of the plurality of the second circuit members is a hollow member having a space from the first circuit member, and in the first sealing step, the plurality of the second circuit members are sealed so as to maintain the space.

According to the above aspect of the present invention, the thermosetting sheet and the thermoplastic sheet are used in a stacked state, as a sealing material. Therefore, the stacked sheets can deform, along with plastic deformation of the thermoplastic sheet, so as to conform to the contours of the gaps between a plurality of the circuit members, without breaking, and can be prevented from entering the internal space. Furthermore, since the thermosetting resin has excellent fixability, the thermosetting sheet can fixedly adhere to the circuit members while the stacked sheets are in a state of being deformed so as to conform to the contours of the gaps, and the fixedly adhering sheet can ensure a certain degree of strength. Thus, the circuit members can be collectively sealed so as to maintain the internal space.

Prior to the disposing step, each sheet may be prepared, or a sheet comprising the thermosetting sheet and the thermoplastic sheet integrated with each other may be prepared (sheet preparation step).

In the first sealing step, the thermosetting sheet is cured into a cured layer (first cured layer). The above manufacturing method may further include a coating film formation step of forming a coating film on the first cured layer after the removal step.

The coating film may include a functional layer having at least one function selected from the group consisting of electrical conductivity, electromagnetic wave shielding property, and electromagnetic wave absorbing property. By providing such a functional layer, electromagnetic waves coming from outside can be shielded. The coating film formation step may include a step of forming a functional layer on the first cured layer. The functional layer may contain an electrically conductive material. The functional layer may be formed by a vapor phase method or a plating method The coating film may include a cured layer (second cured layer). The second cured layer may be formed on the first cured layer or on the functional layer. The coating film formation step can include a step (second sealing step) of forming a second cured layer by curing a curable material on the first cured layer or on the functional layer.

Another aspect of the present invention encompasses a mounting structure produced by the above manufacturing method.

Yet another aspect of the present invention encompasses the above-described sheet used for sealing the above mounting member. In such a sheet, the thermosetting sheet and the thermoplastic sheet may be integrated together. Furthermore, still another aspect of the present invention encompasses the use of the above-described sheet for sealing the above mounting member.

A detailed description will be given below of each step of the manufacturing method of a mounting structure, and the sheet used for sealing the mounting structure, with reference to the drawings as appropriate. It is to be noted, however, that the drawings merely illustrate one embodiment of the present invention, and the following description including examples and numerical ranges is appliable to the present invention without limited to the illustrated embodiment.

FIGS. 1 to 10 are each a schematic diagram for explaining a predetermined step in the manufacturing method according to the above aspect of the present invention, by way of a cross section of the mounting member or mounting structure.

(Preparation of Mounting Member (First Preparation Step))

This step prepares a mounting member including a first circuit member 1 and a plurality of second circuit members 2 placed on the first circuit member 1 (FIG. 1).

The first circuit member 1 is, for example, at least one selected from the group consisting of a semiconductor element, a semiconductor package, a glass substrate, a resin substrate, a ceramic substrate, and a silicon substrate. These first circuit members may have on its surface an electrically conductive material layer, such as ACF (anisotropic conductive film) or ACP (anisotropic conductive paste). The resin substrate may be rigid or flexible, examples of which include an epoxy resin substrate (e.g., glass epoxy substrate), a bismaleimide triazine substrate, a polyimide resin substrate, and a fluororesin substrate. The first circuit member 1 may be a component built-in substrate incorporating a semiconductor chip and the like therein.

The second circuit members 2 include a reference member 21, a first adjacent member 22 adjacent to the reference member 21, and a second adjacent member 23 adjacent to the reference member 21. A separation distance D1 between the reference member 21 and the first adjacent member 22 and a separation distance D2 between the reference member 21 and the second adjacent member 23 may be different from each other as illustrated, or the same as each other. A height ΔH1 from the reference member 21 of the first adjacent member 22 and a height ΔH2 from the reference member 21 of the second adjacent member 23 may be different from each other as illustrated, or the same as each other. When the separation distances D1 and D2 are different from each other and/or when the heights ΔH1 and ΔH2 are different from each other, the first circuit member 1 and the second circuit members 2 form projections and recesses whose sizes and shapes are nonuniform. In this case, the sheet becomes difficult to conform to the contours of the projections and recesses, failing to collectively seal the circuit members so as to maintain the internal space. According to the above aspect of the present invention, even in such a case, the sheet can deform to conform to the contours of the projections and recesses, so as to maintain the internal space, and thus, the circuit members can be collectively sealed. Although the illustrated example includes three second circuit members 2, this is not a limitation, and the number of the second circuit members 2 may be two, or may be four or more.

The height ΔH is a height at the highest point (the point farthest away from the first circuit member 1) of a member adjacent to the reference member 21, relative to a height at the highest point of the reference member 21 when viewed from the principal surface of the first circuit member 1, and is a value reflecting whether it is higher or lower than the reference member 21. For example, in the case where the first adjacent member 22 is higher than the reference member 21, and the second adjacent member 23 is lower than the reference member 21, even when the difference in height between the first adjacent member 22 and the reference member 21 is the same as that between the second adjacent member 23 and the reference member 21, the heights ΔH1 and ΔH2 are different. Also, for example, in the case where the first adjacent member 22 has the same height as the reference member 21 (ΔH1=0), and the second adjacent member 23 is higher (or lower) than the reference member 21, the heights ΔH1 and ΔH2 are different.

When the separation distance D2 is larger than the separation distance D1, the ratio of the separation distance D2 to the separation distance D1 may be 200% or more, and may be 300% or more. According to a sheet 4P, even when there is a great difference in the separation distance as above, these second circuit members 2 can be collectively sealed. A separation distance D is a shortest distance between the reference member 21 and a member adjacent thereto (in the illustrated example, the adjacent member 22 or 23) when viewed from a direction normal to the principal surface of the first circuit member 1.

The separation distance D is set as appropriate according to the size of the first circuit member 1, the number, size, and method of placing of the second circuit members 2, and the like, and is not limited. According to the sheet 4P, even when the separation distance is narrow (e.g., the separation distance is 150 μm or less) or when the second circuit member is high (e.g., the height is 200 μm or more), these second circuit members 2 can be collectively sealed. The lower limit of the separation distance D may be set as appropriate according to the thickness of the sheet 4P, and may be, for example, 10% or more and 4000% or less of a thickness T of the sheet 4P. When the separation distance D is within the range above relative to the thickness T of the sheet 4P, the sheet 4P becomes more likely to enter the gaps between the second circuit members. The separation distance D may be, for example, 10 μm or more and 6 mm or less, and may be 10 μm or more and 2000 μm or less. In view of narrowing the pitches and achieving high-dense mounting, the mounting member preferably has at least one portion having a separation distance D of, for example, 400 μm or less (preferably 200 μm or less, more preferably 150 μm or less, or 100 μm or less). According to the above aspect of the present invention, even when the separation distance D is small as above, the circuit members can be collectively sealed with excellent sealing quality.

When the first adjacent member 22 is higher than the second adjacent member 23, the ratio of the height of the first adjacent member 22 to that of the second adjacent member 23 may be 200% or more, and may be 300% or more. According to the sheet 4P, even when there is a great difference in height like this, these second circuit members 2 can be collectively sealed. The height of the first adjacent member 22 is a distance to the point farthest from the first circuit member 1 of the first adjacent member 22, and the height of the second adjacent member 23 is a distance to the point farthest from the first circuit member 1 of the second adjacent member 23.

The second circuit members 2 include a hollow member placed on the first circuit member 1, with bumps 3 interposed therebetween (in the illustrated example, the reference member 21 and the second adjacent member 23). The first circuit member 1 and the hollow member form a space therebetween, which is referred to as an internal space S. The hollow member is an electronic component that needs to be sealed (hollow-sealed) with the internal space S maintained. Examples of the hollow member include an RFIC chip, a SAW chip, a sensor chip (e.g., acceleration sensor), a piezoelectric oscillator chip, a quartz oscillator chip, and a MEMS device. Examples of the second circuit members 2 other than the hollow member include an FBAR filter, a BAW filter, a chip multilayer LC filter, a dielectric filter, and a multi-layered ceramic capacitor (MLCC).

In short, the mounting member may have various structures in which the second circuit members 2 are placed on various kinds of the first circuit member 1, such as a chip-on-board (CoB) structure (including chip-on-wafer (CoW), chip-on-film (CoF), and chip-on-glass (CoG)), a chip-on-chip (CoC) structure, a chip-on-package (CoP) structure, and a package-on-package (PoP) structure. The mounting member may be a multi-layered mounting member in which, for example, on the first circuit member 1 with the second circuit members 2 placed thereon, the first member and/or the second circuit members 2 are further placed.

The bumps (first bumps) 3 have electrical conductivity, and the first circuit member 1 and the hollow member are electrically connected to each other via the first bumps 3. The first bumps 3 may have any height, for example, 5 μm or more and 150 μm or less. The first bumps 3 may be made of any material that has electrical conductivity, examples of which include copper, gold, and solder balls.

(Sheet Preparation Step (Second Preparation Step))

This step prepares a sheet (sheet-form sealing material) 4P including a thermosetting sheet 41P and a thermoplastic sheet 42P (FIG. 1). The illustrated example shows the case of preparing a sheet 4P comprising a thermosetting sheet 41P and a thermoplastic sheet 42P integrated with each other, but not limited thereto, and the thermosetting sheet 41P and the thermoplastic sheet 42P may be prepared separately. In the case of preparing the thermosetting sheet 41P and the thermoplastic sheet 42P separately, these sheets may be stacked into a stack in a subsequent disposing step. In this case also, except that the thermosetting sheet 41P and the thermoplastic sheet 42P are not integrated together in the second preparation step, the configuration of each sheet and the procedures and conditions of each step in the manufacturing method of a mounting structure are the same or similar to those when using the integrated sheet 4P.

(Sheet 4P (Sheet-Form Sealing Material))

The sheet 4P is a member configured to collectively seal a plurality of the second circuit members 2.

The sheet 4P may be configured in any way as long as the thermosetting sheet 41P and the thermoplastic sheet 42P can be used in a stacked state in the subsequent disposing step, and may include another sheet (third sheet) other than the sheets 41P and 42P.

According to the sheet 4P, a plurality of the second circuit members 2 that include a hollow member and are arranged at various intervals can be collectively sealed so as to maintain the internal space S of the hollow member. In general, the smaller the separation distance is, the more difficult it is for the sheet-form sealing material to enter the gaps between the circuit members. The sheet 4P, however, has an elasticity that makes it difficult to enter the internal space S and a viscosity that allows it to enter and extend between the second circuit members 2 regardless of the size of the separation distance therebetween.

When using the sheet 4P, even though the plurality of the second circuit members 2 have different heights from the first circuit member 1, the plurality of the second circuit members 2 can be collectively sealed, so as to maintain the internal space S of the hollow member. The sheet 4P has a viscosity that allows it to extend within a small gap, toward the first circuit member 1. Therefore, once the sheet 4P can enter between the second circuit members 2, the sheet 4P can extend until reaching the surface of the first circuit member 1, regardless of the heights of the second circuit members 2.

Whether or not the sheet 4P enters the internal space S and between the second circuit members 2 depends greatly on the viscoelasticity of the thermosetting sheet 41P facing the second circuit members 2 or the thermoplastic sheet 42P adjacent thereto. Therefore, with respect to at least one of the thermosetting sheet 41P and the thermoplastic sheet 42P, the loss tangent tan δ and the storage shear modulus G' of a material constituting the sheet at a temperature t when the second circuit members 2 are sealed may be controlled within a specific range.

For example, with respect to a material constituting at least one of the thermosetting sheet 41P and the thermoplastic sheet 42P, the loss tangent tan δ is controlled to satisfy 0.1 or more and 0.8 or less, and the storage shear modulus G' is controlled to satisfy $1 \times 10^4$ Pa or more and $1 \times 10^7$ Pa or less, at the temperature t when the second circuit members 2 are sealed. This makes it easy to seal the plurality of the second circuit members 2 collectively, so as to maintain the internal space S. Especially, even when the second circuit members 2 are arranged at different intervals or have different heights, they can be collectively sealed.

Preferably, a thermosetting material constituting the thermosetting sheet satisfies the above range of the loss tangent tan δ and the storage shear modulus G' because in this case the internal space S having a variety of shapes and arrangements tends to be easily sealed. Particularly preferably, the sheet according to one embodiment of the present invention includes a thermosetting sheet formed of a thermosetting material having the loss tangent tan δ and the storage shear modulus G' within the ranges above.

The temperature t when the second circuit members 2 are sealed is a temperature of the sheet 4P when the surfaces of the second circuit members 2 are covered with the sheet 4P, with the internal space S maintained.

The loss tangent tan δ is a ratio: G"/G' of a loss shear modulus (G") to a storage shear modulus G' of a material constituting the sheet at the temperature t. The storage shear modulus G' and the loss shear modulus G" can be measured with a rheometer complying with JIS K 7244-1:1998. Specifically, the storage shear modulus G' and the loss shear modulus G" can be measured on a test piece of 8 mm in diameter×1 mm thick, using a rheometer (e.g., ARES-LS2, available from TA instruments, Inc.) at a frequency of 1 Hz and a temperature rise rate of 10° C./min.

Herein, in measuring the physical property values etc. with respect to each of the thermosetting sheet 41P and the thermoplastic sheet 42P, a test piece may be prepared from each of the sheets before integration. When it is difficult to prepare a test piece from each of the sheets before integration, each sheet separated from the sheet 4P may be used, as described above. The separation of each sheet may be done by any method. For example, one of the thermosetting sheet 41P and the thermoplastic sheet 42P in the sheet 4P may be separated by peeling from the other, or the other sheet may be removed to collect one of the sheets. The test piece used for measurement of the physical property values etc. may be prepared from each sheet separated in this way. However, when it is difficult to prepare a test piece from the sheet, for example, when the thickness of each sheet is too small or too large, a test piece made from a material constituting each of the thermosetting sheet 41P and the thermoplastic sheet 42P may be used to measure the physical property values etc.

(Thermosetting Sheet 41P)

A thermosetting material constituting the thermosetting sheet 41P has a loss tangent tan δ1 at the temperature t which is, for example, 0.1 or more and 0.6 or less, and may be 0.1 or more and 0.4 or less. The thermosetting material has a storage shear modulus G1' at the temperature t which may be $1 \times 10^4$ Pa or more and $1 \times 10^7$ Pa or less, may be $1 \times 10^4$ Pa or more and $5 \times 10^6$ Pa or less (e.g., $1 \times 10^5$ Pa or more and $5 \times 10^6$ Pa or less), and may be $1 \times 10^4$ Pa or more and $1 \times 10^6$ Pa or less.

In view of electrical insulation, the thermosetting layer 41P has a volumetric resistivity of preferably $1 \times 10^8$ Ω·cm or more, more preferably $1 \times 10^{10}$ Ω·cm or more.

The volumetric resistivity of the thermosetting layer 41P can be measured, for example, using a commercially available instrument, such as a resistivity meter (e.g., Hiresta-UP, available from Mitsubishi Chemical Analytech Co., Ltd.).

The thermosetting layer 41P has a thickness T1 which may be any thickness. The thickness T1 is preferably 100 μm or less, more preferably 70 μm or less, and may be 50 μm or less. This can facilitate the entry between the second circuit members 2 even when the separation distance therebetween is small, and can reduce the height of a mounting structure 10. The thickness T1 is preferably 5 μm or more because in this case the internal space S tends to be easily maintained. The thickness T1 of the thermosetting layer 41P is a distance between the principal surfaces of the thermosetting layer 41P. The distance between the principal surfaces can be determined by averaging the distances at 10 randomly selected points. A thickness T2 of the thermoplastic sheet 42P can be determined similarly to T1.

Note that the thicknesses T1 and T2 of the sheets 41P and 42P, and the thickness of the sheet 4P are each a thickness before pressing against the first circuit member.

An elongation percentage (average elongation percentage) at 25° C. of the thermosetting material before curing is not limited, but is preferably 50% or more and 3000% or less. This facilitates the entry of the thermosetting sheet 41P between the second circuit members 2.

Note that the elongation percentage of the thermosetting material is a value measured using a test piece of 30 mm long, 10 mm wide and 100 μm thick prepared by sheeting the thermosetting material similarly to forming the thermosetting sheet 41P. For example, with a rheometer (e.g., ARES, available from TA instruments, Inc.), the elongation percentage is measured at a shear rate of $0.1\ \mathrm{s}^{-1}$ at 25° C. in a constant Hencky strain mode, using a jig (Extensional Viscosity Fixture). The elongation percentage is a ratio of the difference between a length L1 of the test piece upon occurrence of a crack therein and a length L0 of the initial test piece (=L1−L0) to L0 (=(L1−L0)/L0×100(%)). With respect to a plurality of test pieces (e.g., 5 pieces), the elongation percentage is measured, and the measured values are averaged to determine an average elongation percentage.

The thermosetting sheet 41P is formed of a thermosetting material. The thermosetting material (first thermosetting material) may be, for example, a resin composition containing a thermosetting resin and a curing agent.

The thermosetting resin before sealing may be in an uncured state or in a semi-cured state. The semi-cured state means a state in which the thermosetting resin includes a monomer and/or an oligomer, and the development of three-dimensional cross-linked structure of the thermosetting resin is insufficient. The semi-cured thermosetting resin is in a so-called B stage, i.e., a state in which the resin does not dissolve in a solvent at room temperature (25° C.) but is not cured completely.

Examples of the thermosetting resin include, but not limited to, epoxy resin, acrylic resin, phenol resin, melamine resin, silicone resin, urea resin, urethane resin, vinyl ester resin, unsaturated polyester resin, diallyl phthalate resin, and polyimide resin. These may be used singly or in combination of two or more kinds thereof. Preferred is an epoxy resin.

Examples of the epoxy resin include, but not limited to, bisphenol A-type epoxy resin, bisphenol F-type epoxy resin, bisphenol AD-type epoxy resin, hydrogenated bisphenol A-type epoxy resin, hydrogenated bisphenol F-type epoxy resin, phenol novolac-type epoxy resin, naphthalene-type epoxy resin, alicyclic aliphatic epoxy resin, and glycidyl ethers of organic carboxylic acids. These may be used singly or in combination of two or more kinds thereof. The epoxy resin may be a prepolymer or may be a copolymer of an epoxy resin and another polymer, such as polyether-modified epoxy resin or silicone-modified epoxy resin. Preferred are a bisphenol AD-type epoxy resin, a naphthalene type epoxy resin, a bisphenol A-type epoxy resin, and/or a bisphenol F-type epoxy resin. Particularly preferred are a bisphenol A-type epoxy resin and a bisphenol F-type epoxy resin because of their excellent heat resistance and water resistance and their inexpensive prices.

For viscosity adjustment of the resin composition, the epoxy resin can include a monofunctional epoxy resin having one epoxy group in its molecule, in an amount of approximately 0.1 mass % or more and 30 mass % or less in the whole epoxy resin. Examples of the monofunctional epoxy resin include phenylglycidyl ether, 2-ethylhexyl glycidyl ether, ethyldiethylene glycol glycidyl ether, dicyclopentadiene glycidyl ether, and 2-hydroxyethyl glycidyl ether. These may be used singly or in combination of two or more kinds thereof.

The resin composition includes a curing agent for the thermosetting resin. Examples of the curing agent include, but not limited to, a phenolic curing agent (e.g., phenol resin), a dicyandiamide-based curing agent (e.g., dicyandiamide), a urea-based curing agent, an organic acid hydrazide-based curing agent, a polyamine salt-based curing agent, an amine adduct-based curing agent, an acid anhydride-based curing agent, and an imidazole-based curing agent. These may be used singly or in combination of two or more kinds thereof. The kind of the curing agent may be selected as appropriate according to the thermosetting resin. Preferred is a phenol-based curing agent because of its low outgassing during curing, moisture resistance, and heat cycle resistance.

The amount of the curing agent differs depending on the kind of the curing agent. When an epoxy resin is used, for example, the curing agent may be used in an amount such that the functional group equivalent of the curing agent is 0.001 eq or more and 2 eq or less, and further 0.005 eq or more and 1.5 eq or less, per one equivalent of the epoxy group.

The dicyandiamide-based curing agent, the urea-based curing agent, the organic acid hydrazide-based curing agent, the polyamine salt-based curing agent, and the amine adduct-based curing agent are latent curing agents. The activation temperature of the latent curing agent may be 60° C. or higher, and may be 80° C. or higher. The activation temperature may be 250° C. or lower, and further may be 180° C. or lower. When the activation temperature is within the range above, a resin composition that can cure quickly at a temperature equal to or higher than the activation temperature can be easily obtained.

The activation temperature herein refers to a temperature at which the curing of the thermosetting material is accelerated rapidly by the action of the latent curing agent and/or the curing accelerator.

The resin composition may contain a third component other than the above. Examples of the third component include a thermoplastic resin, an inorganic filler, a curing accelerator, a polymerization initiator, an ion catcher, a flame retardant, a pigment, a silane coupling agent, and a thixotropic agent.

The thermoplastic resin can be blended as a sheeting agent. The resin composition formed into a sheet exhibits improved handleability in the sealing process and is unlikely to cause dripping or other inconveniences. This serves to maintain the internal space S.

The thermoplastic resin may be of the following kind: for example, acrylic resin, phenoxy resin, polyolefin, polyurethane, polyether, polyester, polyimide, polyvinyl acetate or its saponified product (including polyvinyl alcohol), butyral resin, polyamide, polyvinyl chloride, polyvinylidene chloride, cellulose, thermoplastic epoxy resin, and thermoplastic phenol resin. Preferred is an acrylic resin because it functions well as a sheeting agent. The amount of the thermoplastic resin may be 5 parts by mass or more and 200 parts by mass or less, and may be 10 parts by mass or more and 100 parts by mass or less, per 100 parts by mass of the thermosetting resin.

The thermoplastic resin may be added in any form to the resin composition. For example, the thermoplastic resin may be particles having an average diameter of, for example, 0.01 µm or more and 200 µm or less (or 0.01 µm or more and 100 µm or less). The particles may have a core-shell structure. In this case, the core may be, for example, a polymer containing a unit derived from at least one monomer selected from the group consisting of n-, i-, and t-butyl (meth)acrylates, and may be a polymer containing a unit derived from a (meth)acrylate other than the above. The shell layer may be, for example, a copolymer of a monofunctional monomer, such as methyl(meth)acrylate, n-, i-, or t-butyl(meth)acrylate, or (meth)acrylic acid, and a polyfunctional monomer, such as 1,6-hexanediol diacrylate. Also, for example, a high-purity thermoplastic resin dispersed or dissolved in a solvent may be added to the resin composition.

Herein, acrylate and methacrylate are collectively referred to as (meth)acrylate, and acrylic acid and methacrylic acid are collectively referred to as (meth)acrylic acid.

Furthermore, the average particle diameter herein refers to a particle diameter at 50% cumulative volume in a volumetric particle size distribution (D50; this applies hereinafter).

Examples of the inorganic filler include silica such as fused silica, talc, calcium carbonate, titanium white, red iron oxide, silicon carbide, boron nitride (BN), and alumina. Preferred is a fused silica because of its inexpensive price. The average particle diameter (D50) of the inorganic filler is, for example, 0.01 µm or more and 100 µm or less. The amount of the inorganic filler may be 1 part by mass or more and 5000 parts by mass or less, and may be 10 parts by mass or more and 3000 parts by mass, per 100 parts by mass of the thermosetting resin.

Examples of the curing accelerator include, but not limited to, a modified imidazole-based curing accelerator, a modified aliphatic polyamine-based accelerator, and a modified polyamine-based accelerator. The curing accelerator may be used in the form of a reaction product (adduct) with a resin such as an epoxy resin. These may be used singly or in combination of two or more kinds thereof. In view of storage stability, the activation temperature of the curing accelerator is preferably 60° C. or higher, more preferably 80° C. or higher. The activation temperature may be 250° C. or lower, and may be 180° C. or lower.

The amount of the curing accelerator differs depending on the kind of the curing accelerator. Normally, the amount may be 0.1 part by mass or more and 20 parts by mass or less, and may be 1 part by mass or more and 10 parts by mass or less, per 100 parts by mass of the epoxy resin. When the curing accelerator is used in the form of an adduct, the amount of the curing accelerator means the net amount of the curing accelerator excluding the amount of the components (e.g., epoxy resin) other than the curing accelerator.

The polymerization initiator exhibits curability by irradiation with light and/or application of heat. The polymerization initiator may be, for example, a radical generator, an acid generator, or a base generator. Specific examples thereof include a benzophenone-based compound, a hydroxy ketone-based compound, an azo compound, an organic peroxide, and a sulfonium salt, such as an aromatic sulfonium salt or aliphatic sulfonium salt. The amount of the polymerization initiator may be 0.1 part by mass or more and 20 parts by mass or less, and may be 1 part by mass or more and 10 parts by mass or less, per 100 parts by mass of the epoxy resin.

The viscoelasticity (i.e., loss tangent tan δ) of the first thermosetting material can be adjusted, for example, by the material of the thermosetting sheet 41P. For example, changing the amount or the kind of the thermoplastic resin serving as the sheeting agent can change the loss tangent tan δ. Specifically, using a phenoxy resin can easily lower the storage shear modulus G' and increase the tan δ.

The thermosetting sheet 41P may have a single layer structure, or a layered structure of two or more layers. In the case of a layered structure, at least two adjacent layers may differ in composition (e.g., kind and/or amount of the constituent component). The amount of each component may be set such that the amount in each layer satisfies the above range. The thickness of each layer may be adjusted such that the thickness T1 of the thermosetting sheet 41P satisfies the above range.

(Thermoplastic Sheet 42P)

Between the thermoplastic sheet 42P and the thermosetting sheet 41P, a third sheet other than these sheets may be disposed. However, for ease of collectively sealing a plurality of the second circuit members 2 so as to maintain the internal space S of the hollow member, the thermoplastic sheet 42P and the thermosetting sheet 41P are preferably disposed adjacently to each other.

The thermoplastic sheet 42P may have any thickness. For increased ease in maintaining the internal space S and allowing the sheet 4P to conform to the gaps between the second circuit members, the thermoplastic sheet 42P preferably has a thickness T2 of 50 µm or more and 500 µm or less, more preferably 100 µm or more and 400 µm or less.

The thermoplastic sheet 42P is formed of various materials having thermoplasticity (thermoplastic materials). The thermoplastic material may be, for example, a thermoplastic resin, or a resin composition including a thermoplastic resin and an additive, but is not limited thereto as long as it has thermoplasticity.

Examples of the thermoplastic resin include those exemplified as the sheeting agent for the thermosetting sheet 41P. Other examples of the thermoplastic resin include a vinyl resin and a rubbery polymer. The thermoplastic resin may have hot-melt adhesive properties. Preferred examples of the thermoplastic resin include a polyolefin resin, a polyurethane resin, a vinyl resin (e.g., ethylene-vinyl acetate copolymer), a polyester resin, and a polyamide resin. Among them, a thermoplastic resin having hot-melt adhesive properties is more preferred. Specifically, in view of allowing the sheet 4P to conform to the gaps between the second circuit members and removing thermoplastic sheet 42P smoothly from a cured product of the thermosetting sheet 4P, a polyolefin resin is preferred, and in view of excellent balance between viscosity and elasticity, a polyurethane resin is preferred. The thermoplastic resins may be used singly or in combination of two or more kinds.

The thermoplastic material (e.g., thermoplastic resin) constituting the thermoplastic sheet 42P has a melting point (or glass transition temperature) $t_m$ which is preferably equal to or lower than the temperature t, more preferably lower than the temperature t. The melting point (or glass transition temperature) $t_m$ is, for example, 50° C. or higher and 150° C. or lower, and preferably 50° C. or higher and 130° C. or lower. When the melting point (or glass transition temperature) $t_m$ of the thermoplastic material is within the range above, the conformability of the sheet 4P is likely to be ensured in the first sealing step, and the thermoplastic sheet 42P is likely to be easily removed by, for example, peeling, in the thermoplastic sheet removal step.

The melting point (or glass transition temperature) $t_m$ of the thermoplastic material can be measured using a test piece of the thermoplastic sheet by differential scanning calorimetry (JIS K7121) at a temperature rise rate of 10° C./min.

The thermoplastic sheet may contain various additives, such as a filler, a plasticizer, a flame retardant, a mold release agent, and a pigment. The thermoplastic sheet may contain one kind or two or more kinds of additives.

The viscoelasticity (i.e., loss tangent tan δ) of the thermoplastic material can be adjusted by, for example, constituent components of the thermoplastic sheet 42P. For example, the loss tangent tan δ can be adjusted by changing the kind of the thermoplastic resin or the additive, the amount of the additive, or the ratio of each resin when two or more thermoplastic resins are used.

A loss tangent tan δ2 at the temperature t of the thermoplastic material can be selected, for example, from the range described for tan δ1, and may be greater than 0.6. The tan δ2 may be greater than 0.9 and 2 or less, and may be 1 or greater and 2 or less. A storage shear modulus G2' at the temperature t of the thermoplastic material can be selected from the range described for G1', and may be $0.5 \times 10^4$ Pa or more and $1 \times 10^7$ Pa or less, and may be $1 \times 10^4$ Pa or more and $1 \times 10^6$ Pa or less.

The thermoplastic sheet 42P may have a single layer structure, or a layered structure of two or more layers. In the case of a layered structure, at least two adjacent layers may differ in composition (e.g., kind and/or amount of the constituent component). The thickness of each layer may be adjusted such that the thickness T2 of the thermoplastic sheet 42P satisfies the above range. In the case of a layered structure, for example, at least a sheet (layer A1) in contact with the thermosetting sheet 41P may be formed of a thermoplastic resin that allows the sheet 4P to conform to the gaps between the second circuit members and allows the thermoplastic sheet 42P to be removed smoothly from a cured product of the thermosetting sheet 41P, and a layer (layer A2) adjacent to the layer A1 may be formed of a thermoplastic resin that is excellent in balance between viscosity and elasticity.

With regard to the thermoplastic material, a 50% modulus of a sheet of the thermoplastic material is preferably 8 MPa or less, and may be 3 MPa or more and 8 MPa or less. In this case, the sheet 4P can enter even a minute gap so as to conform to its contour. A breaking strength of the sheet of the thermoplastic material is preferably 10 MPa or more, and may be 10 MPa or more and 30 MPa or less. An elongation at break of the sheet of the thermoplastic material is preferably 100% or more (e.g., 100% or more and 1000% or less), and may be 200% or more and 1000% or less. When the thermoplastic sheet 42P is formed of a thermoplastic material that exhibits a breaking strength and/or an elongation at break as above when formed into sheet, the thermoplastic sheet 42P tends to be easily removed completely from the cured product of the thermosetting sheet 41P in a later removal step, while allowing the sheet 4P to enter even a minute gap so as to conform to its contour. In particular, the sheet according to one embodiment of the present invention preferably includes a thermoplastic sheet composed of a thermoplastic material which exhibits a 50% modulus, a breaking strength, and an elongation at break within the range above, and particularly preferably is a sheet in which the thermoplastic sheet as above is integrated with a thermosetting sheet composed of a thermosetting material having the loss tangent tan δ and the storage shear modulus G' within the aforementioned range.

The 50% modulus, the breaking strength, and the elongation at break are measured using a 100-μm-thick test piece formed of the thermoplastic material. The test piece is usually prepared by sheeting similarly to forming the thermoplastic sheet 42P, in a thickness of 100 μm and a width of 15 mm. The measurement is performed at a chuck interval of 50 mm and a tensile speed of 200 mm/min. A commercially available tensile tester may be used for the measurement. The elongation at break is a ratio of the difference between a length L2 of the test piece at break and a length L0 of the initial test piece (=L2−L0) to L0 (=(L2−L0)/L0× 100(%)). With respect to a plurality of test pieces (e.g., 5 pieces), each physical property is measured, and the measured values are averaged. The above-mentioned ranges of the 50% modulus, the breaking strength, and the elongation at break are of the averaged values.

At 25° C., the elongation percentage (average elongation) of the thermoplastic material is, for example, 250% or more, may be 300% or more, and may be 500% or more, or 1000% or more. When the thermoplastic material has an elongation percentage like this, the sheet 4P can enter even a minute gap so as to conform to its contour. The upper limit of the elongation percentage of the thermoplastic material is not particularly limited, but is preferably 2000% or less in view of removing the thermoplastic sheet 42P completely from a cured product of the thermosetting sheet 41P in the removal step.

The elongation percentage of the thermoplastic material can be measured at 25° C. similarly to measuring the elongation percentage of the thermosetting material, except for using a test piece prepared by sheeting similarly to forming the thermoplastic sheet 42P. With respect to a plurality of test pieces (e.g., 5 pieces), the elongation percentage is measured, and the measured values are averaged to determine an average elongation percentage.

(Others)

The thickness T of the whole sheet 4P is not limited, but in view of achieving a close contact with the surfaces of the second circuit members 2, the thickness is preferably 55 μm or more and 1500 μm or less, and may be 100 μm or more and 1000 μm or less, and may be 100 μm or more and 500 μm or less.

When the sheet 4P includes a third sheet, for example, a material constituting the third layer has a loss tangent tan δ3 at the temperature t which may be 0.2 or more and 1.0 or less, and a storage shear modulus G3' which may be $1\times10^4$ Pa or more and $1\times10^7$ Pa or less. In addition, in the sheet 4P, while the thermosetting sheet 41P is disposed on the outermost layer so as to face the first circuit member 1, the third sheet may be disposed on the outermost layer on the side opposite to the thermosetting sheet 41P. The third sheet may have a single layer structure, or a layered structure of two or more layers.

The method of producing the sheet 4P is not limited. The sheet 4P may be formed by separately forming each of the layers 41P and 42P, and laminating the layers together (laminating method), or by coating with a material of each layer one after another (coating method). For example, the sheet 4P may be produced by coating one of the surfaces of the thermoplastic sheet 42P with a material of the thermosetting sheet 41P.

In the laminating method, each of the layers 41P and 42P is formed by a process including, for example, a step of preparing a solvent paste or solvent-free paste containing the material of each sheet (hereinafter, simply collectively referred to as paste), and a step (forming step) of forming each sheet from the paste. The thermoplastic sheet 42P may be formed by a known thermoplastic sheet molding method, such as an extrusion molding method. After forming the thermosetting sheet 41P and the thermoplastic sheet 42P each through the above process, these sheets are stacked in this order. When the paste contains a pre-gelling agent, gelation is carried out during the forming step. The gelation is carried out after the paste is formed into a thin film, by heating the thin film at a temperature lower than the curing temperature of the material of the thermosetting sheet 41P (e.g., at 70° C. or higher and 150° C. or lower) for 1 min to 10 min.

On the other hand, in the coating method, for example, after forming the thermoplastic sheet 42P through the above process, a paste containing a material of the thermosetting sheet 41P is applied onto a surface of the thermoplastic sheet 42P, to form the thermosetting sheet 41P. In this case also, gelation can be carried out during the forming step. The gelation may be carried out one after another for each paste formed into a thin film, or may be carried out after the thin films are layered into a stack.

When using a paste, the layer (thin film) may be formed using, for example, a die, a roll coater, or a doctor blade. In this case, the paste may be adjusted to have a viscosity of 10 mPa·s or more and 10,000 mPa·s or less. When a solvent paste is used, this may be followed by drying at a temperature of 70° C. or higher and 150° C. or lower for 1 min or more and 10 min or less, to remove the solvent. The gelation and the removal of the solvent can be carried out simultaneously.

(Disposing Step)

Figure 2:
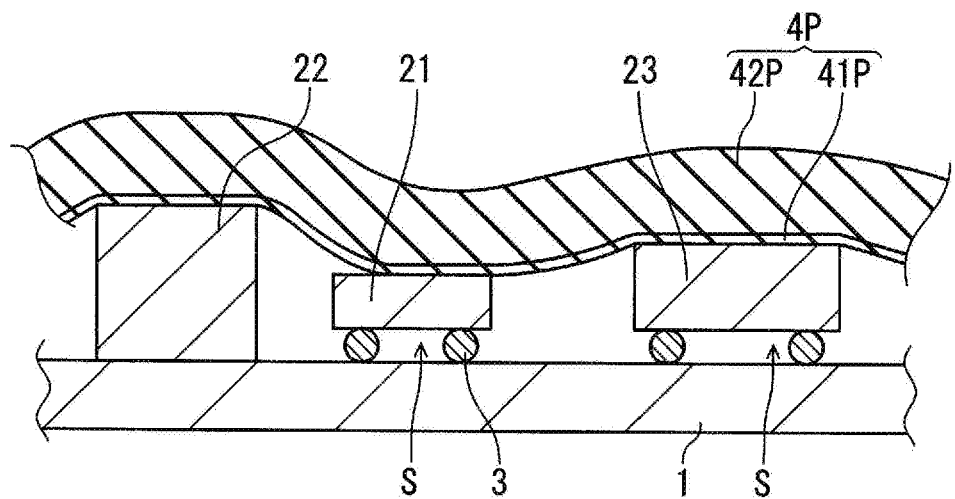
FIG. 2 A schematic diagram for explaining a disposing step in the manufacturing method according to one embodiment of the present invention by way of a cross section of the mounting member or mounting structure.

This step disposes the thermosetting sheet 41P and the thermoplastic sheet 42P on the mounting member such that the thermosetting sheet 41P is interposed between the thermoplastic sheet 42P and the first circuit member 1 (FIG. 2). Specifically, a stack of the thermosetting sheet 41P and the thermoplastic sheet 42P (including the sheet 4P) is disposed so as to cover a plurality of the second circuit members 2.

When the thermosetting sheet 41P and the thermoplastic sheet 42P are not integrated together, the thermosetting sheet 41P and the thermoplastic sheet 42P may be overlapped with each other and disposed on the mounting member in this step such that the thermosetting sheet 41P faces the second circuit members 2. In the case of using a third sheet, the third sheet may be disposed at a predetermined position in this step. The sheets may be overlapped one after another on the mounting member, or may be overlapped with each other in advance and disposed on the mounting member.

In the case of using the thermosetting sheet 41P and the thermoplastic sheet 42P integrated together like the sheet 4P, one sheet 4P is disposed on the mounting member such that the thermosetting sheet 41P faces the second circuit members 2.

(First Sealing Step)

Figure 4:
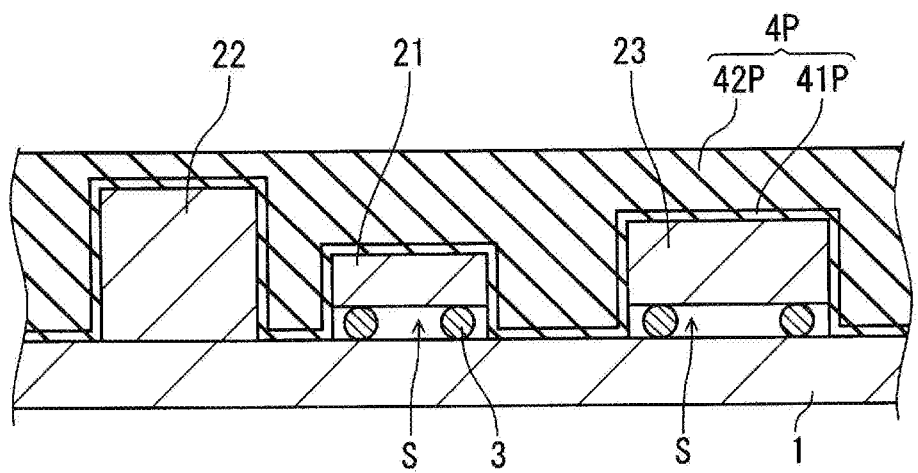
FIG. 4 A schematic diagram for explaining the first sealing step in the manufacturing method according to one embodiment of the present invention by way of a cross section of the mounting member or mounting structure.
Figure 5:
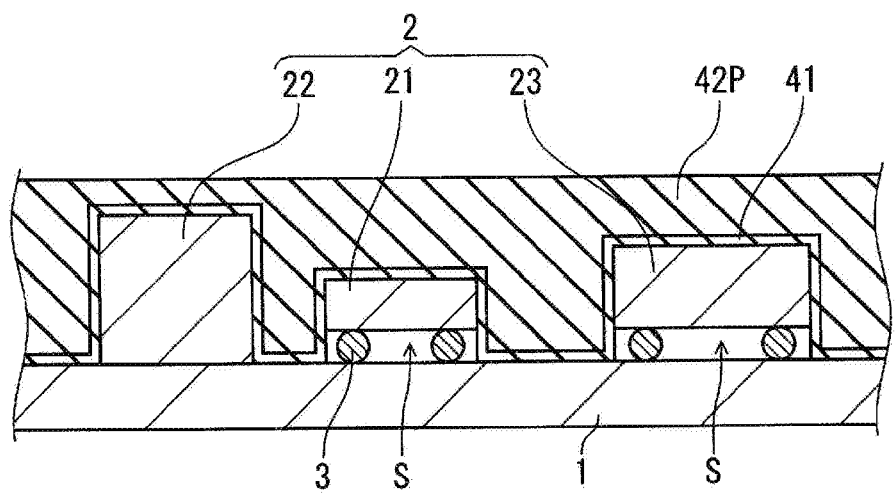
FIG. 5 A schematic diagram for explaining the first sealing step in the manufacturing method according to one embodiment of the present invention by way of a cross section of the mounting member or mounting structure.

This step presses a stack of the thermosetting sheet 41P and the thermoplastic sheet 42P (including the sheet 4P) against the first circuit member 1 (FIGS. 3 and 4), and heating the sheet 4P, to seal the second circuit members 2 placed on the first circuit member 1, and to cure the thermosetting sheet 41P into a first cured layer 41 (FIG. 5). In this way, the second circuit members 2 are sealed so as to maintain the internal space S. When the stack is used to seal the second circuit members 2 as above, the thermoplastic sheet 42P also deforms (or is molded) to conform to the contours of the second circuit members 2. Along with the deformation of the thermoplastic sheet 42P, the thermosetting sheet 41P can also deform and conform to the contours of the second circuit members 2. Thus, the first cured layer 41 formed by curing of the thermosetting sheet 41P also has projections and recesses corresponding to the contours of the second circuit members 2.

Figure 3:
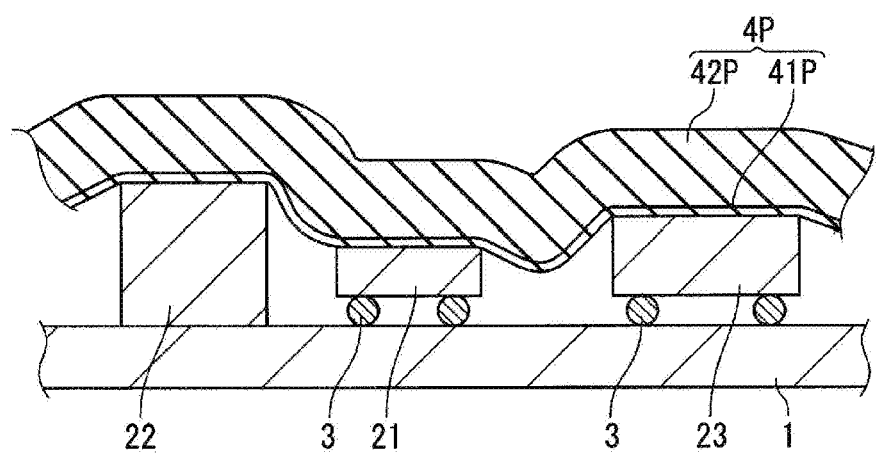
FIG. 3 A schematic diagram for explaining a first sealing step in the manufacturing method according to one embodiment of the present invention by way of a cross section of the mounting member or mounting structure.

More specifically, first, when the sheet 4P is pressed against the first circuit member 1, the sheet 4P starts entering the gaps between the second circuit members 2 placed on the first circuit member 1, as shown in FIG. 3. As the pressing is continued, the sheet 4P extends and fills the gaps between the second circuit members 2 so as to come in close contact with the surfaces of the second circuit members 2, as shown in FIG. 4. As the thermoplastic sheet 42P plastically deforms, the thermosetting sheet 41P can deform to conform to the gaps between the second circuit members 2, and at the same time, with excellent adhesiveness of the thermosetting sheet 41P, the thermosetting sheet 41P can fixedly adhere along the contours of the gaps between the second circuit members 2. Furthermore, with the thermoplastic sheet 42P, the sheet 4P can extend without breaking. Therefore, excellent sealing can be ensured.

The pressing of the sheet 4P against the first circuit member 1 is performed, for example, while heating the sheet 4P at a temperature lower than the curing temperature of the thermosetting sheet 41 (specifically, the thermosetting material contained in the thermosetting sheet 41P) included in the sheet 4P. This easily allows the sheet 4P to come in close contact with the surfaces of the second circuit members 2, as well as to extend until it reaches the surface of the first circuit member 1 between the second circuit members 2, making it possible to enhance the reliability of sealing of the second circuit members 2.

The conditions of heating for pressing are not limited, and may be set as appropriate according to the pressing method and the kind of the thermosetting resin. The heating is performed, for example, at 40° C. or higher and 200° C. or lower, or 50° C. or higher and 180° C. or lower (e.g., 60° C. or higher and 160° C. or lower). The heating may be performed for any length of time, for example, for 1 sec to 300 min (or 3 sec to 300 min).

The pressing may be performed under a pressurized atmosphere (under a pressure higher than 0.1 MPa), or atmospheric pressure, or a reduced pressure atmosphere (e.g., 10 Pa or more and 0.05 MPa or less, or 50 Pa or more and 3 kPa or less).

The pressing is performed by any known method that can press the sheet against the circuit member. The pressing may be performed, for example, using a press (hot pressing), or using a laminator or the like. Optionally, with a pressure applied to the sheet 4P from the side opposite to the first circuit member 1, the sheet 4P may be allowed to conform to the projections and recesses formed by the second circuit members 2. With the pressure reduced between the sheet 4P and the first circuit member 1, the sheet 4P may be allowed to conform to the projections and recesses formed by the second circuit members 2. In either case, by performing under heating, the sheet 4P can be easily allowed to conform to the contours of the projections and recesses formed by the second circuit members 2.

Note that the temperature t of the sheet 4P when the second circuit members are sealed can be replaced with a setting temperature of a heating means for heating the sheet 4P in the first sealing step. When the heating means for the sheet 4P is a press machine, the setting temperature of the heating means is a setting temperature of the press machine. When the heating means for the sheet 4P is a heater for heating the first circuit member 1, the setting temperature of the heating means is a setting temperature of the heater for the first circuit member 1. The temperature t can be changed according to, for example, the material of the sheet 4P, and may be, for example, between room temperature+15° C. (40° C.) and 200° C. Specifically, the temperature t is, for example, 50° C. or higher and 180° C. or lower, and may be 60° C. or higher and 160° C. or lower. The pressing time may be, for example, 1 sec or more and 300 min or less, and may be 3 sec or more and 300 min or less. When the second circuit members 2 are sealed, the thermosetting sheet 41P may be in an uncured state or in a semi-cured state. In view of securing high fillability of the sheet 4P in the gaps between the second circuit members, the temperature t is preferably higher than the melting point (or glass transition temperature) $t_m$ of the thermoplastic material constituting the thermoplastic sheet 42P.

Subsequently, if necessary, the sheet 4P may be heated at the above curing temperature to cure the thermosetting sheet 41P in the sheet 4P, thereby to form a sealing material formed of a cured product 41. As a result, the second circuit members 2 are sealed. The conditions for heating the sheet 4P (curing the thermosetting sheet 41P) may be set as appropriate according to the kind of the thermosetting material contained in the thermosetting sheet 41P. The curing of the thermosetting sheet 41P is performed, for example, at 50° C. or higher and 200° C. or lower (or 120° C. or higher and 180° C. or lower). The heating time is not limited, but is, for example, 1 sec to 300 min (or 60 min to 300 min). Although depending on the kind of the thermoplastic material constituting the thermoplastic sheet 42P, in view of securing high fillability in the gaps between the second circuit members, the thermoplastic sheet 42P is preferably in a fused or softened state in the process of curing of the thermosetting sheet 41P. In other words, it is preferable to cure the thermosetting sheet 41P at a temperature equal to or higher than the glass transition temperature (or the melting point) of the thermoplastic material.

The pressing and the curing of the thermosetting sheet 41P may be performed separately or simultaneously. For example, after pressing in a reduced pressure atmosphere at a temperature lower than the curing temperature of the thermosetting material contained in the thermosetting sheet 41P, the reduced pressure is released, and heating may be performed under atmospheric pressure at a higher temperature, to cure the thermosetting sheet 41P. After pressing under atmospheric pressure at a temperature lower than the curing temperature of the thermosetting material contained in the thermosetting sheet 41P, heating may be performed at a higher temperature, to cure the thermosetting sheet 41P. Alternatively, the pressing may be performed in a reduced pressure atmosphere at the curing temperature, so that the thermosetting sheet 41P is cured under reduced pressure.

Note that the cured product 41 in the first sealing step may not be completely thermally cured, and only needs to be firmly cured so that the thermoplastic sheet can be removed in a subsequent removal step. In this case, for example, after the thermoplastic sheet is removed, the cured product 41 is completely cured. Furthermore, for example, when a later-described second sealing step is performed, the cured product 41 may be completely cured in the second sealing step.

(Thermoplastic Sheet Removal Step)

Figure 6:
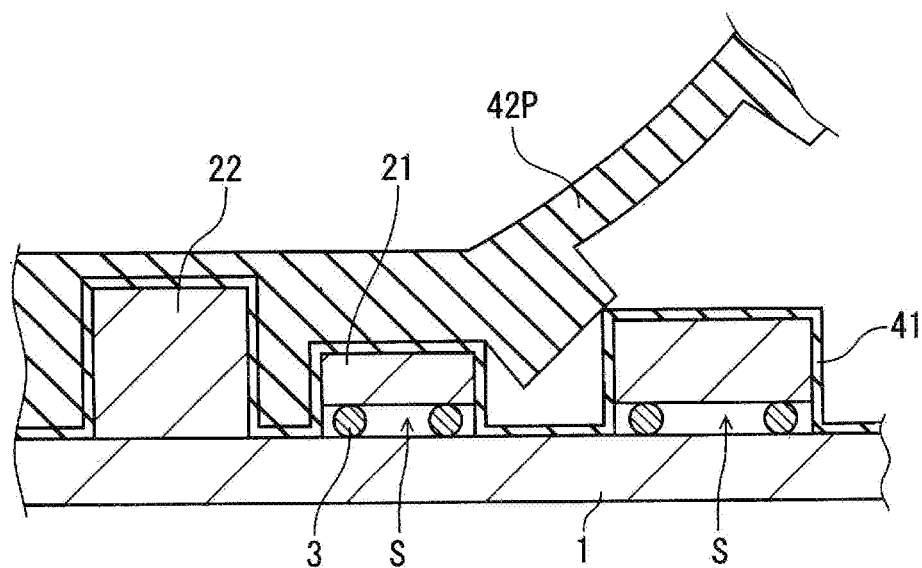
FIG. 6 A schematic diagram for explaining a thermoplastic sheet removal step in the manufacturing method according to one embodiment of the present invention by way of a cross section of the mounting member or mounting structure.
Figure 7:
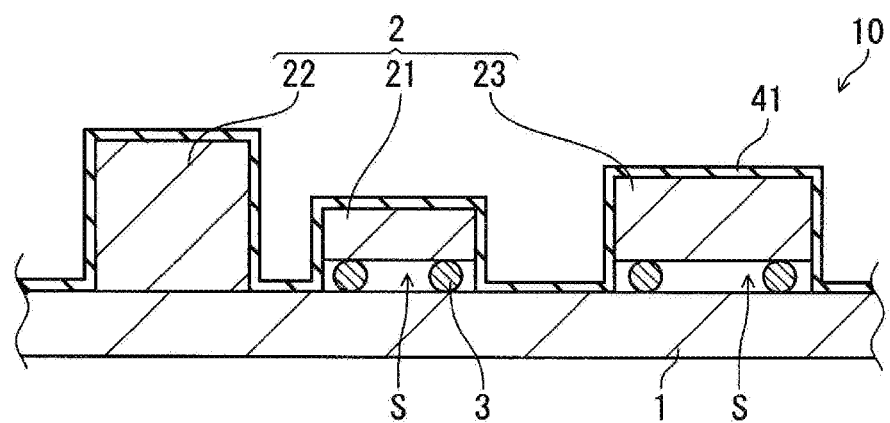
FIG. 7 A schematic diagram for explaining the thermoplastic sheet removal step in the manufacturing method according to one embodiment of the present invention by way of a cross section of the mounting member or mounting structure.

This step removes the thermoplastic sheet 42P from the first cured layer 41 formed by curing the thermosetting sheet 41P in the first sealing step (FIG. 6). This provides a mounting structure 10 in which the second circuit members are sealed with the first cured layer 41 (FIG. 7). The thermoplastic sheet may be removed by means of, for example, dissolution or peeling. The removal by peeling may be done chemically or physically. When some residue of the thermoplastic sheet remains after the first removal by one means, the residue may be removed by another means. FIG. 6 shows a case where the thermoplastic sheet is removed by peeling.

A description will be given below of a case where the thermoplastic sheet is removed by physical peeling.

The peeling of the thermoplastic sheet 42P is preferably performed at a temperature of, for example, equal to or lower than the melting point or glass transition temperature of the thermoplastic material constituting the thermoplastic sheet 42P, for example, 40° C. or lower, or at room temperature (specifically, 20° C. or higher and 35° C. or lower). At such a temperature, the viscosity of the thermoplastic sheet 42P is low, and the elasticity is high. In the first sealing step, the thermosetting sheet 41P is cured, and its stickiness is reduced. Therefore, the thermoplastic sheet 42P can be readily peeled off by utilizing its high elasticity, from the first cured layer 41. The breakage of the first cured layer 41 can also be suppressed.

(Coating Film Formation Step)

Figure 8:
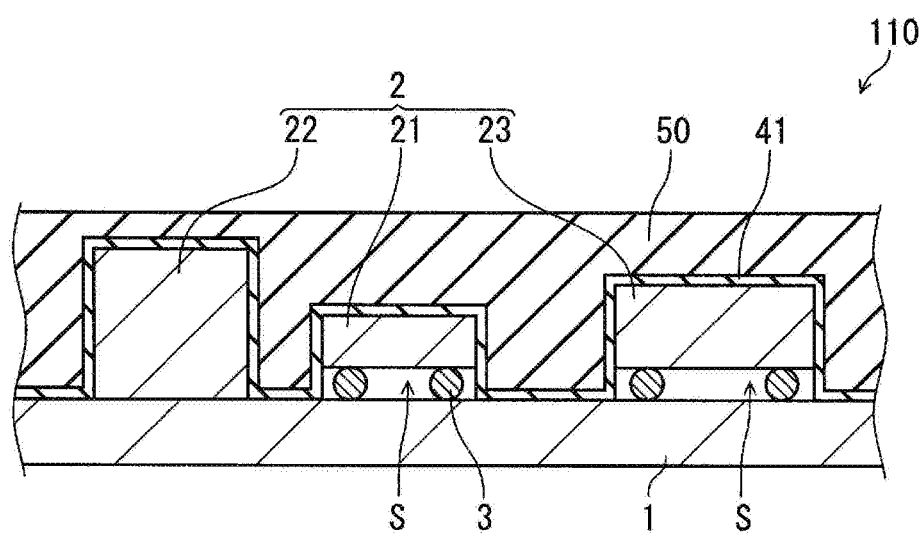
FIG. 8 A schematic diagram for explaining a coating film formation step in the manufacturing method according to one embodiment of the present invention by way of a cross section of the mounting member or mounting structure.
Figure 9:
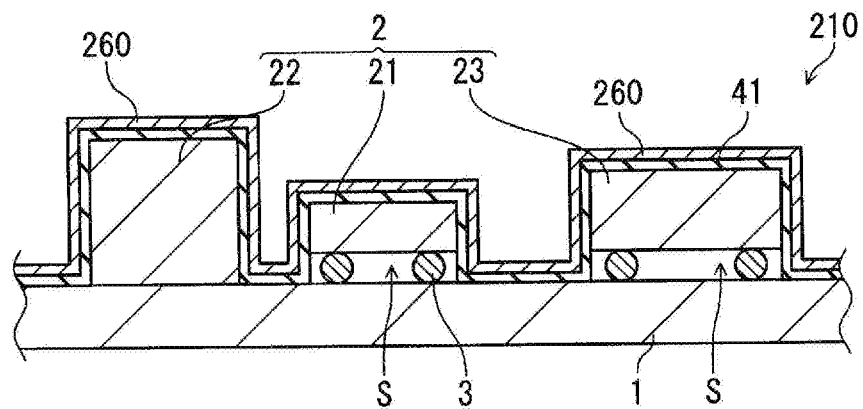
FIG. 9 A schematic diagram for explaining a coating film formation step in a manufacturing method according to another embodiment of the present invention by way of a cross section of the mounting member or mounting structure.
Figure 10:
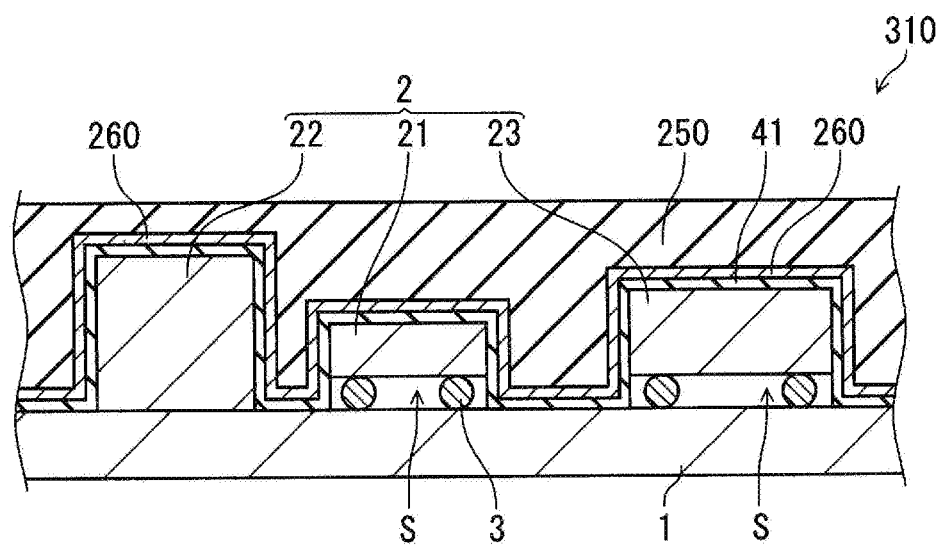
FIG. 10 A schematic diagram for explaining a coating film formation step in a manufacturing method according to yet another embodiment of the present invention by way of a cross section of the mounting member or mounting structure.

After the thermoplastic sheet removal step, if necessary, a coating film may be formed on the first cured layer 41 (FIGS. 8 to 10). This process is referred to as a coating film formation step. The coating film may include a layer (functional layer) having functionalities, such as electrical conductivity, heat dissipation property, electromagnetic shielding property, and/or electromagnetic wave absorbing property. Particularly when the coating film includes a functional layer having electrical conductivity, electromagnetic wave shielding property, and/or electromagnetic wave absorbing property, electromagnetic waves coming from outside can be shielded, and electrical interference between the circuit members can be reduced. Moreover, since the functional layer can be provided only where necessary, electrical interference between the circuit members can be effectively eliminated.

The coating film may include a second cured layer formed by curing of a curable material (second curable material). The second cured layer may be formed on the first cured layer or on the functional layer.

The coating film may comprise one layer, or two or more layers. For example, the coating film may comprise the functional layer only, or the second cured layer only, or both the functional layer and the second cured layer. The coating film formation step may include a functional layer formation step and/or a second cured layer formation step (second sealing step). When the coating film comprises the functional layer and the second cured layer, the functional layer may be disposed between the first cured layer and the second cured layer. The second cured layer may be disposed between the first cured layer 41 and the functional layer.

When the coating film comprises the second cured layer, the second circuit members 2 are to be sealed with the first cured layer 41 and a second cured layer 50 formed by curing of the second curable material (FIG. 8).

FIG. 9 shows a mounting structure 210 in which an electromagnetic wave shielding layer 260 having electrical conductivity is formed on the first cured layer 41. In the mounting structure 210, an internal space S is formed via bumps (first bumps) 3, between the first circuit member 1 and the second circuit member 2 being a hollow member. The second circuit members 2 are sealed with the first cured layer 41 and the functional layer 260, with the internal spaces S maintained.

The electromagnetic wave shielding layer 260 may be electrically connected to second bumps disposed on the surface of the first circuit member 1. In this case, the second bumps are electrically connected to a conductor within the first circuit member 1. In this way, in the coating film formation step, the electromagnetic wave shielding layer 260 and the conductor are electrically connected to each other. By providing the electromagnetic wave shielding layer 260, electromagnetic waves can be shielded, and electrical interference between the circuit members can be reduced.

FIG. 10 shows a mounting structure 310 in which the electromagnetic wave shielding layer 260 is formed on the first cured layer 41, and a second cured layer 250 is formed by curing of the second curable material on the electromagnetic wave shielding layer 260. FIG. 10 differs from FIG. 9 only in that the second cured layer 250 is formed.

When using a sheet-form sealing material to seal the circuit members, the priority is placed on the physical properties of the sealing material that allow the sealing material to enter small gaps between the circuit members but does not allow to enter the internal space. This means that there is little selectivity for the surface condition and physical properties of the sealing material after sealing. For example, the sheet-form sealing material, despite filling the gaps between the circuit members, may sometimes have surface irregularities whose shape is difficult to control.

According to the above aspect of the present invention, after the second circuit members are sealed using the sheet 4P so as to maintain the internal space, the thermoplastic sheet 42P is removed. Therefore, a coating film of another material can be formed on the second circuit members 2, with the first cured layer 41 interposed therebetween. For example, in the case of forming a functional layer, various functions can be imparted to the mounting structure. Furthermore, in the case of performing the second sealing step, the second circuit members 2 can be sealed again together with the first cured layer 41, with another material (i.e., the second curable material). Since these coating films have no need to have such properties as required when sealing so as to maintain the internal space, the selectivity on the material can be improved. Moreover, it is easy to control the condition after sealing of the sealing material, like flattening the unevenness of the first cured layer 41 or smoothing the surface of the sealing material, and to adjust the thickness of the sealing material. It is also easy to impart another functionality. Note that in the case of forming a coating film, it may be formed on the entire surface or part of the surface of the first cured layer 41. In addition, according to the above embodiment of the present invention, since the thermoplastic sheet 42P is to be removed, the overall thickness of the layers formed on the circuit members can be kept small even though a coating film is formed. This leads to a lower height of the mounting structure. In the case of forming a coating film (e.g., functional layer) using an electrical conductive material or the like by a gas phase method or a plating method, as compared to using the material in the form of a paste, sheet or the like, the thickness of the coating film such as the electromagnetic wave shielding layer 260 (e.g., functional layer) can be reduced. This also leads to a lower height of the mounting structure. Since the functional layer can be formed in a smaller thickness, the amount of the material used for forming the functional layer, such as the electromagnetic wave shielding layer, can be reduced, which is advantageous in terms of cost.

The second curable material may be any known material. The second curable material may be photocurable or thermosetting. The thermosetting material may be in the form of liquid or sheet. The photocurable material may be, for example, a resin composition containing a photocurable resin and a curing agent. Examples of the thermosetting material include those exemplified for the first thermosetting material. The thermosetting material used as the second curable material may be the same as or different from the first thermosetting material. The thermosetting material may be a curable material having functionalities, such as electrical conductivity, heat dissipation property, electromagnetic wave shielding property, and electromagnetic wave absorption property. The second cured layer 250 can be formed, for example, by applying or filling a curable material onto the first cured layer 41 or onto the functional layer, such as the electromagnetic wave shielding layer 260, and curing the material. A sheet-form second curable material may be disposed on the first cured layer 41 or on the functional layer, and cured, into the second cured layer 250. A stack of a functional layer and a sheet-form second curable material may be disposed on the first cured layer 41, followed by curing the second curable material, to form the second cured layer.

The material for forming the electromagnetic wave shielding layer 260 may be, for example, a material having electrical conductivity, electromagnetic wave shielding property, and/or electromagnetic wave absorbing property. The electromagnetic wave shielding layer 260 exhibits electromagnetic shielding property, usually by having electrical conductivity. The material having electrical conductivity may be a curable material having electrical conductivity. Examples of the curable material include those exemplified for the second curable material. The curable material may be in the form of liquid or sheet as in the case of the second curable material. When a curable material is used, the electromagnetic wave shielding layer 260 is a cured product of the curable material. The curable material may include an additive, such as an electrically conductive material or a material for shielding and/or absorbing electromagnetic waves. Examples of the additive include an electrically conductive carbon material, and a metal material (e.g., single metal, alloy, metal compound with electrical conductivity). The additives may be used singly or in combination of two or more kinds thereof. The additive may be particulate and/or fibrous. When the electromagnetic wave shielding layer 260 is formed from a curable material, the electromagnetic wave shielding layer 260 can be formed by, for example applying or filling a curable material having electrical conductivity onto the first cured layer 41, and curing the material.

The electromagnetic wave shielding layer 260 may be formed from a metal material. Examples of the metal material include a single metal (e.g., silver, copper), an alloy (e.g., silver alloy, copper alloy), and a metal compound with electrical conductivity (e.g., oxide, nitride). When a metal material is used, the electromagnetic wave shielding layer 260 can be formed by, for example, a vapor phase method and/or a plating method. Examples of the vapor phase method include vapor deposition, ion plating, ion beam deposition, and sputtering. Two or more selected from these vapor phase methods may be combined, if necessary. Examples of the plating method include electrolytic plating and electroless plating. Two or more plating methods may be combined, if necessary. Depending on the kind of the metal material, known technique and conditions may be used in the vapor phase method and the plating method.

The thickness of the coating film is, for example, 10 nm or more and 500 µm or less. The thickness of the coating film is, for example, 1 µm or more and 500 µm or less, and may be 5 µm or more and 300 µm or less, and may be 10 µm or more and 100 µm or less. When the functional layer is formed by a vapor phase method and/or a plating method, the thickness of the functional layer is, for example, 10 nm or more and 50 µm or less, and may be 10 nm or more and 30 µm or less.

Examples of the second bumps include plated bumps formed by a plating technique, bumps formed by a screen printing, and so-called stud bumps. The stud bumps are each formed by, for example, heating the tip of a metal wire until it becomes like a ball, joining the ball to the first circuit member 1 at a predetermined position, and drawing and cutting the metal wire. The stud bumps may be, for example, gold stud bumps.

When the second bumps are provided, the conductor is disposed inside the first circuit member 1, serving to connect the second bumps to, for example, a ground electrode (not shown). The conductor can be made of, for example, an electrically conductive paste, metal particles, or the like The sealing step or the coating film formation step may be followed by a singulation step of dicing the obtained mounting structure 10. The singulation step may be performed on each of the second circuit members.

EXAMPLES

The present invention will be more specifically described below with reference to Example and Reference Example. It is to be noted, however, the present invention is not limited to the following Examples.

Example 1

On a glass epoxy substrate (first circuit member, 50 mm square, thickness: 0.2 mm), the same type of four SAW chips A, B, C and D (second circuit member, 1.1 mm×1.1 mm, height: 0.2 mm) were placed in line, with gold bumps (each 100 μm in diameter and 20 μm in height) interposed therebetween, to form a mounting member. A separation distance D1 between the SAW chips A and B was 0.4 mm, a separation distance D2 between the SAW chips B and C was 0.1 mm, and a separation distance D3 between the SAW chips C and D was 0.2 mm. The mounting member was sealed with a sheet stack (a stack of a thermosetting sheet (first layer) and a thermoplastic sheet (second layer)). In a sealing step, with the sheet stack disposed such that the surface of the thermosetting sheet (first layer) came in contact with the second circuit member side, the sheet stack was pressed under heating at 120° C. (sealing temperature), for 1 min under a reduced pressure atmosphere (200 Pa). This was followed by heating in an oven at 150° C. under 1 atm (≈0.1 MPa) for 180 min, and by subsequent cooling to room temperature. The thermoplastic sheet (second layer) was then peeled off, to obtain a mounting structure.

The sheet stack used here was a stack of a thermosetting sheet (thickness: 12 μm) and a thermoplastic sheet (thickness: 250 μm) which were heat-laminated together. The thermoplastic sheet was a sheet of an olefinic resin. The thermosetting sheet was produced by a coating method using a resin composition containing the following components (on a mass basis).

Epoxy resin (thermosetting resin): 100 parts
Phenol novolac (curing agent): 60 parts
Acrylic resin (thermoplastic resin): 60 parts
Fused spherical silica (inorganic filler): 100 parts
Imidazole (curing accelerator): 2 parts With respect to each of the materials constituting the thermosetting sheet and the thermoplastic sheet before forming into a sheet stack, its physical property values were measured by the above-described procedures. The results showed that the elongation percentage at 25° C. of the thermosetting material before curing was 150%, the loss tangent tan δ1 at the temperature t when the SAW chip was sealed, i.e., at 120° C., was 0.1, and the storage shear modulus G1' was $2 \times 10^5$ Pa. As for the thermoplastic material, the 50% modulus at 25° C. was 7.0 MPa, the elongation at break was 600%, the breaking strength was 25.0 MPa, and the melting point ($t_m$) was 100° C.

Reference Example 1

A mounting structure was obtained in the same manner as in Example 1, except that a stack of a first layer and a second layer both having thermosetting property was used as the sheet stack, and peeling was not performed after cooling. In the sheet stack, the thermosetting sheet (thickness: 12 μm) as used in Example 1 was used as the first layer, and as the second layer, a thermosetting sheet (thickness: 250 μm) prepared by a coating method using a resin composition containing the components shown in Table 1 at a ratio shown in Table 1 was used. These thermosetting sheets were overlapped with each other, and heat-laminated as in Example 1, to form a sheet stack. Note that the phenoxy resin used in Reference Example 1 was a thermoplastic resin. With respect to the material constituting each of the sheets, its physical property values were measured by the above-described procedures.

<<Evaluation>>

Example and Reference Example were evaluated for the following properties.

(1) Sealing Property

With respect to the mounting structure, the sealed condition of each of the portions corresponding to the separation distances D1, D2 and D3 between the SAW chips was checked from the chip bottom (back side of substrate), and the gap-sealing property was evaluated according to the following criteria.

A: No void due to lack of filling and no resin intrusion were observed, showing excellent gap-sealing property.

B: No resin intrusion was observed, but a very small void due to lack of filling was observed in part.

C: Resin intrusion at the chip bottom was observed.

D: A large void due to lack of resin filling was observed.

(2) Peeling Property

After the peeling-off of the second layer, the surface (sealing material surface after peeling) of the first cured layer (first layer) of the mounting structure was observed, and the peeling property (removal property) of the second layer was evaluated according to the following criteria.

A: The second layer has been removed completely from the surface of the first layer.

B: The second layer has not been removed from the surface of the first layer.

The results of Example and Reference Example are shown in Table 1. Table 1 also shows the physical property values of each sheet or the material constituting the sheet, the raw material composition of the thermosetting sheet, and the sealing temperature.

TABLE 1

| | | Ex. 1 | Ref. Ex. 1 |
|---|---|---|---|
| First layer | Thermosetting sheet | | |
| | Epoxy resin (pts.m) | 100 | |
| | Phenol novolac (pts.m) | 60 | |
| | Acrylic resin (pts.m) | 60 | |
| | Fused spherical silica (pts.m) | 100 | |
| | Imidazole (pts.m) | 2 | |
| | Thickness (μm) | 12 | |
| | Elongation (%) (25° C.) | 300 | |
| | tan δ | 0.1 | |
| | | (120° C.) | |
| | Storage shear modulus G1' (Pa) | $2 \times 10^5$ | |
| | | (120° C.) | |
| Second layer | Thermoplastic sheet | olefinic resin sheet | |
| | Melting point $t_m$ (° C.) | 100 | |
| | 50% modulus (MPa) | 7.0 | |
| | Breaking strength (MPa) | 25.0 | |
| | Elongation at break (%) | 600 | |
| | Thermosetting sheet | | |
| | Epoxy resin (pts.m) | | 100 |
| | Phenol novolac (pts.m) | | 60 |
| | Acrylic resin (pts.m) | | 20 |
| | Phenoxy resin (pts.m) | | 15 |
| | Fused spherical silica (pts.m) | | 1100 |
| | Imidazole (pts.m) | | 2 |
| | Thickness (μm) | 250 | |
| | tan δ | 1.25 | 0.5 |
| | | (120° C.) | (120° C.) |
| | Storage shear modulus G2' (Pa) | $4.9 \times 10^4$ | $2 \times 10^6$ |
| | | (120° C.) | (120° C.) |

TABLE 1-continued

|  |  | Ex. 1 | Ref. Ex. 1 |
|---|---|---|---|
| Sealing temperature (° C.) | | 120 | 120 |
| Sealing property | D2 (0.1 mm) | A | D |
| | D3 (0.2 mm) | A | A |
| | D1 (0.4 mm) | A | A |
| Peeling property | | A | B |

Table 1 shows that Example was excellent in the gap-sealing property as well as in the peeling property of the second layer from the first layer, as compared to Reference Example. Specifically, in Example 1, neither a void due to lack of filling nor a trace of resin intrusion was observed, showing excellent gap-sealing property. Also, visual inspection on the cured layer surface (sealing material surface after peeling) of the mounting structure confirmed that the thermoplastic sheet was completely removed therefrom. In Reference Example 1, as a result of visual inspection on the mounting structure for its gap-sealing property, a large void due to lack of resin filling was observed between the SAW chips B and C, showing that the gap-sealing property was insufficient.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

According to the manufacturing method and the sheet of the above aspects of the present invention, a plurality of circuit members can be collectively sealed so as to maintain the internal space. In particular, even when a plurality of circuit members are arranged at a narrow interval or at different intervals, and/or a plurality of circuit members having different heights are arranged, the circuit members can be collectively sealed so as to maintain the internal space. Therefore, the manufacturing method and the sheet are suitable for sealing circuit members in various uses.

REFERENCE SIGNS LIST

10, 110, 210, 310: mounting structure
1: first circuit member
2: second circuit member
21: reference member
22: first adjacent member
23: second adjacent member
3: first bump
S: internal space
4P: sheet
41P: thermosetting sheet
42P: thermoplastic sheet
41: cured product of thermosetting sheet (sealing material) (first cured layer)
50, 250: cured product of second curable material (second cured layer)
260: electromagnetic wave shielding layer

The invention claimed is:

1. A manufacturing method of a mounting structure, the method comprising:
   a step of preparing a mounting member including a first circuit member and a plurality of second circuit members placed on the first circuit member;
   a disposing step of disposing a thermosetting sheet and a thermoplastic sheet on the mounting member, with the thermosetting sheet interposed between the thermoplastic sheet and the first circuit member;
   a first sealing step of pressing a stack of the thermosetting sheet and the thermoplastic sheet against the first circuit member, and heating the stack, to seal the second circuit members and to cure the thermosetting sheet into a first cured layer;
   a removal step of removing the thermoplastic sheet from the first cured layer; and
   a coating film formation step of forming a coating film on the first cured layer, after the removal step, wherein
   at least one of the plurality of the second circuit members is a hollow member having a space from the first circuit member, and
   in the first sealing step, the plurality of the second circuit members are sealed so as to maintain the space.

2. The manufacturing method of claim 1, wherein
   the coating film includes a functional layer having at least one function selected from the group consisting of electrical conductivity, electromagnetic wave shielding property, and electromagnetic wave absorbing property, and
   the coating film formation step further includes a step of forming the functional layer on the first cured layer.

3. The manufacturing method of claim 2, wherein the functional layer contains an electrically conductive material and is formed by a vapor phase method and/or a plating method.

4. The manufacturing method of claim 2, wherein
   the coating film further includes a second cured layer, and
   the coating film formation step further includes a second sealing step of forming the second cured layer by curing a curable material on the functional layer.

5. The manufacturing method of claim 1, wherein
   the coating film includes a second cured layer, and
   the coating film formation step further includes a second sealing step of forming the second cured layer by filling a curable material onto the first cured layer and curing the curable material.

6. The manufacturing method of claim 1, further comprising a step of preparing a sheet comprising the thermosetting sheet and the thermoplastic sheet integrated with each other, prior to the disposing step, wherein
   in the disposing step, the sheet is disposed on the mounting member.

7. The manufacturing method of claim 1, wherein in the first sealing step, the stack is pressed under heating against the first circuit member.

8. The manufacturing method of claim 1, wherein a thermoplastic material constituting the thermoplastic sheet has a 50% modulus of 3 MPa or more and 8 MPa or less, as measured in a form of 100-μm-thick sheet formed of the thermoplastic material.

9. The manufacturing method of claim 1, wherein a thermoplastic material constituting the thermoplastic sheet has a melting point or glass transition temperature $t_m$ of 50° C. or more and 130° C. or less, and of being lower than a temperature t when the second circuit members are sealed.

10. The manufacturing method of claim 1, wherein a thermosetting material constituting the thermosetting sheet exhibits a loss tangent tan δ0.1 or more and 0.8 or less, and a storage shear modulus of $1\times10^4$ Pa or more and $1\times10^7$ Pa or less, at the temperature t when the second circuit members are sealed.

11. The manufacturing method of claim 1, wherein at least one separation distance between the second circuit members adjacent to each other is 150 μm or less.

12. The manufacturing method of claim 1, wherein
the second circuit members include a reference member, and a first adjacent member and a second adjacent member each adjacent to the reference member, and
a separation distance D1 between the reference member and the first adjacent member is different from a separation distance D2 between the reference member and the second adjacent member.

13. The manufacturing method of claim 1, wherein
the second circuit members include a reference member, and a first adjacent member and a second adjacent member each adjacent to the reference member, and
a height ΔH1 from the reference member of the first adjacent member is different from a height ΔH2 from the reference member of the second adjacent member.

14. The manufacturing method of claim 1, wherein in the first sealing step, the second circuit members are sealed with the stack, and the thermoplastic sheet is deformed to conform to contours of the second circuit members.

15. The manufacturing method of claim 1, wherein the first cured layer has projections and recesses corresponding to the contours of the second circuit members.

16. The manufacturing method of claim 1, wherein a thermoplastic material constituting the thermoplastic sheet has an elongation at break of 200% or more and 1000% or less, as measured in a form of 100-μm-thick sheet formed of the thermoplastic material.

17. The manufacturing method of claim 1, wherein a thermoplastic material constituting the thermoplastic sheet has a breaking strength of 10 MPa or more and 30 MPa or less, as measured in a form of 100-μm-thick sheet formed of the thermoplastic material.

* * * * *